(12) United States Patent
Dike

(10) Patent No.: US 6,512,406 B1
(45) Date of Patent: Jan. 28, 2003

(54) BACKGATE BIASED SYNCHRONIZING LATCH

(75) Inventor: Charles E. Dike, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,437

(22) Filed: Dec. 16, 1999

(51) Int. Cl.$^7$ ................................................. H03K 3/12
(52) U.S. Cl. ........................ 327/200; 327/218; 326/33; 326/94
(58) Field of Search ................................. 327/530, 534, 327/535, 537, 55, 199, 200, 201, 208–212, 218; 326/33, 34, 36, 194, 94

(56) References Cited

U.S. PATENT DOCUMENTS

| | | | | |
|---|---|---|---|---|
| 5,594,381 A | * | 1/1997 | Bingham | 327/534 |
| 5,600,588 A | * | 2/1997 | Kawashima | 365/154 |
| 5,739,702 A | * | 4/1998 | Shigehara et al. | 326/86 |
| 5,764,007 A | * | 6/1998 | Jones | 318/109 |
| 5,917,365 A | * | 6/1999 | Houston | 327/534 |
| 6,031,778 A | * | 2/2000 | Makino et al. | 365/226 |

OTHER PUBLICATIONS

"A 1V DMOS Digital Circuits with Double–Gate–Driven MOSFET," Wong, Louis S. Y. and Rigby, Graham A., ISSCCEE, Feb. 8, 1997.

* cited by examiner

*Primary Examiner*—Tuan T. Lam
(74) *Attorney, Agent, or Firm*—Blakely, Sokoloff, Taylor & Zafman LLP

(57) ABSTRACT

An apparatus having a latch core, where the latch core has a plurality of devices and at least one of the devices has a back gate bias net. A bias voltage circuit is coupled to the back gate bias net. The apparatus may further comprise back to back inverters where each inverter output is coupled to the other inverter input. The inverters may further comprise a PFET transistor and an NFET transistor, where the PFET transistors have a back gate bias net. The inverters may further comprise a PFET transistor and an NFET transistor, the NFET transistors having a back gate bias net. The inverters may further comprise a PFET transistor and an NFET transistor, the NFET transistors and the PFET transistors having a back gate bias net. The bias voltage circuit may be further configured to apply a bias voltage when a metastability may occur. The bias voltage circuit may further comprise a NAND gate.

14 Claims, 5 Drawing Sheets

BACKGATE BIASED SYNCHRONIZING LATCH

FIELD OF INVENTION

The field of the invention relates to semiconductor circuit design generally and, more specifically, the use of back gate biasing in order to reduce the mean propagation delay caused by metastability within a latch core. BACKGROUND OF THE INVENTION FIG. 1b shows an embodiment of a latch circuit 100 having the truth table 101 indicated. As shown in FIG. 1a, the latch circuit refuses to latch if a full data pulse 190 appears after a rising clock edge 191 or if a full data pulse 192 appears before a falling clock edge 193. Referring to FIG. 1b, when the RESET input 102 is low, the gate 103 of NFET transistor i46 is high which turns transistor i46 active (or "on"). When transistor i46 is on it forms a short circuit to ground 104a which provides a logic low signal at the gate node 105 of PFET transistor i69, and NFET transistor i71. The combination of transistors i69 and i71 forms an inverting circuit 108, thus the logic low at their gate node 105, produces a logic high at node 106. The logic high at node 106 is coupled to the inverting circuit formed by transistors i83, i84 resulting in a logic low at the latch circuit output 107. Thus, as seen in the truth table 101, when the RESET input 102 is low, the latch circuit output 107 is typically low (one exception may occur if CLOCK 113 is high and DATA 112 is high-in which case the output 107 is usually high).

Note the combination of transistors i70 and i72 form another inverting circuit 109. The interlocking or back-to-back relationship between inverting circuits 108, 109 (i.e., referring to the inset, the output of each inverting circuit is coupled to the input of the other) forms a latch core 111. Latch cores, such as latch core 111, securely hold a data bit.

Node 106 is driven to specific states for each of the various combinations at input nodes RESET 102, DATA 112, and CLOCK 113. When the RESET input 102 is high, transistor i46 is inactive (or "off") since its gate 103 is a logic low. When i46 is off, the latch core 111 holds its value (i.e., does not change its logical states), since the transistor i46 drain node 120 is controlled by the output of inverter 109 and no channel is formed within transistor i46. Qo is the term used in the truth table 101 to indicate that the specific input combination produces no change at latch circuit output 107. Thus when the RESET input is logic high, the latch output 107 is changed only if so affected by DATA and CLOCK inputs 112, 113.

Another way of stating the above is that the DATA and CLOCK inputs 112, 113 are only useful when the RESET input 102 is high. This is indicated in the truth table 101. When the CLOCK input 113 is logic high, the output of inverting circuit 114 (formed by the combination of transistors i88 and i89) is low which places NFET transistor i64 off. When transistor i64 is off the state of transistor i3 is irrelevant in terms of its affect on node 106. That is, node 106 is driven by the output of inverter circuit 108 when transistor i3 is off. Thus when the CLOCK input 113 is high and the RESET input 102 is high, the latch output 107 remains unchanged as indicated in the truth table 101 by Qo.

When the CLOCK input 113 is low, the transistor i64 gate voltage is high turning transistor i64 on. This places a ground voltage at the source 121 of transistor i3. In this case, if the DATA input 112 is low, transistor i3 is off which, again, leaves node 106 unchanged as it is driven by inverting circuit 108. However, if the DATA input 112 is high, transistor i3 is on which ideally drives node 106 low (since the active channels of transistors i3, i64 form a short circuit to ground 104b). This forces the inverter 109 output high which, being coupled to the input of inverter 108 keeps node 106 low. Thus regardless of the original logic state of node 106, when the RESET input 102 is high, the CLOCK input 113 is low and the DATA input is low the latch circuit output is unchanged. And, as indicated in the truth table 101, when RESET input 102 is high, the CLOCK 113 is low and the DATA input is high, the latch circuit output is high.

In some cases when the latch circuit 100 observes proximately timed transitions in DATA 112 and CLOCK 113, the small skew between DATA 112 and CLOCK 113 causes node 106 and the output of inverting circuit 109 to quasi-balance at a voltage level that is incapable of flipping either inverter circuit 108, 109. As a result, both nodes simply sit at this voltage level and the latch does not flip until a runaway iterative process flips both inverters 108, 109.

SUMMARY OF THE INVENTION

An apparatus comprising a latch core, where the latch core has a plurality of devices and at least one of the devices has a back gate bias net. A bias voltage circuit is coupled to the back gate bias net.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1A:
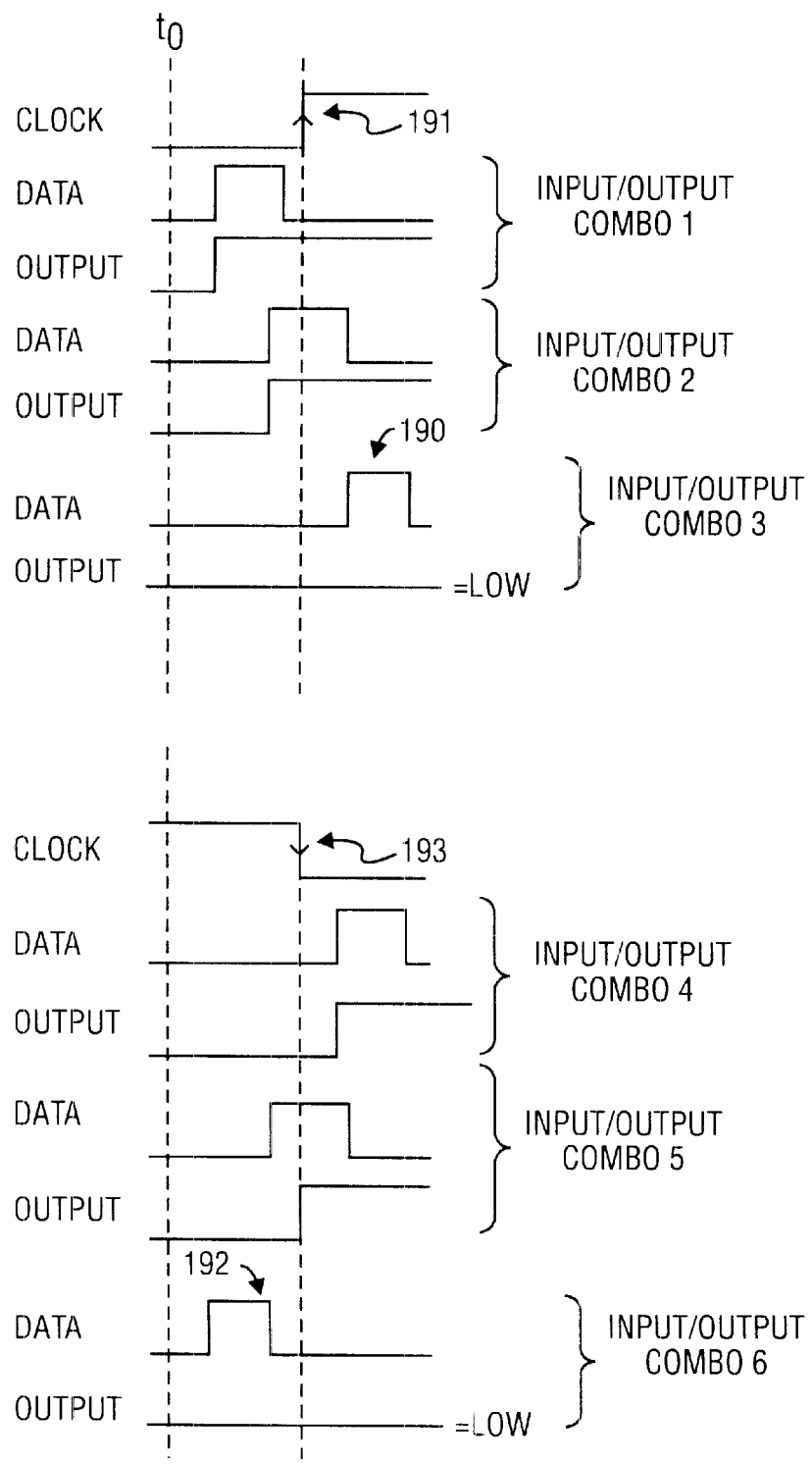
FIG. 1a shows signals associated with the latch embodiment of FIG. 1b.

An apparatus is described having a latch core, where the latch core has a plurality of devices and at least one of the devices has a back gate bias net. A bias voltage circuit is coupled to the back gate bias net. The apparatus may further comprise back to back inverters where each inverter output is coupled to the other inverter input. The inverters may further comprise a PFET transistor and an NFET transistor, where the PFET transistors have a back gate bias net. The inverters may further comprise a PFET transistor and an NFET transistor, the NFET transistors having a back gate bias net. The inverters may further comprise a PFET transistor and an NFET transistor, the NFET transistors and the PFET transistors having a back gate bias net. The bias voltage circuit may be further configured to apply a bias voltage when a metastability may occur. The bias voltage circuit may further comprise a NAND gate.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

In order to address the metastability problem its occurrence must be better understood. As shown back in FIG. 1b, when the CLOCK input 113 is low and the DATA input 112 is high, the latch circuit output 107 is set high (when the RESET input 102 is high). In typical applications the relationship between the edges of CLOCK 113 and DATA 112 are as shown in FIG. 2a. That is, in order to affirmatively set the latch high, the DATA signal 212a must be high for a amount of time 201 while the CLOCK signal 213a is low. This allows sufficient transistors i3 and i64 (referring briefly back to FIG. 1b) to turn on and pull down node 106 to ground.

Figure 1B:
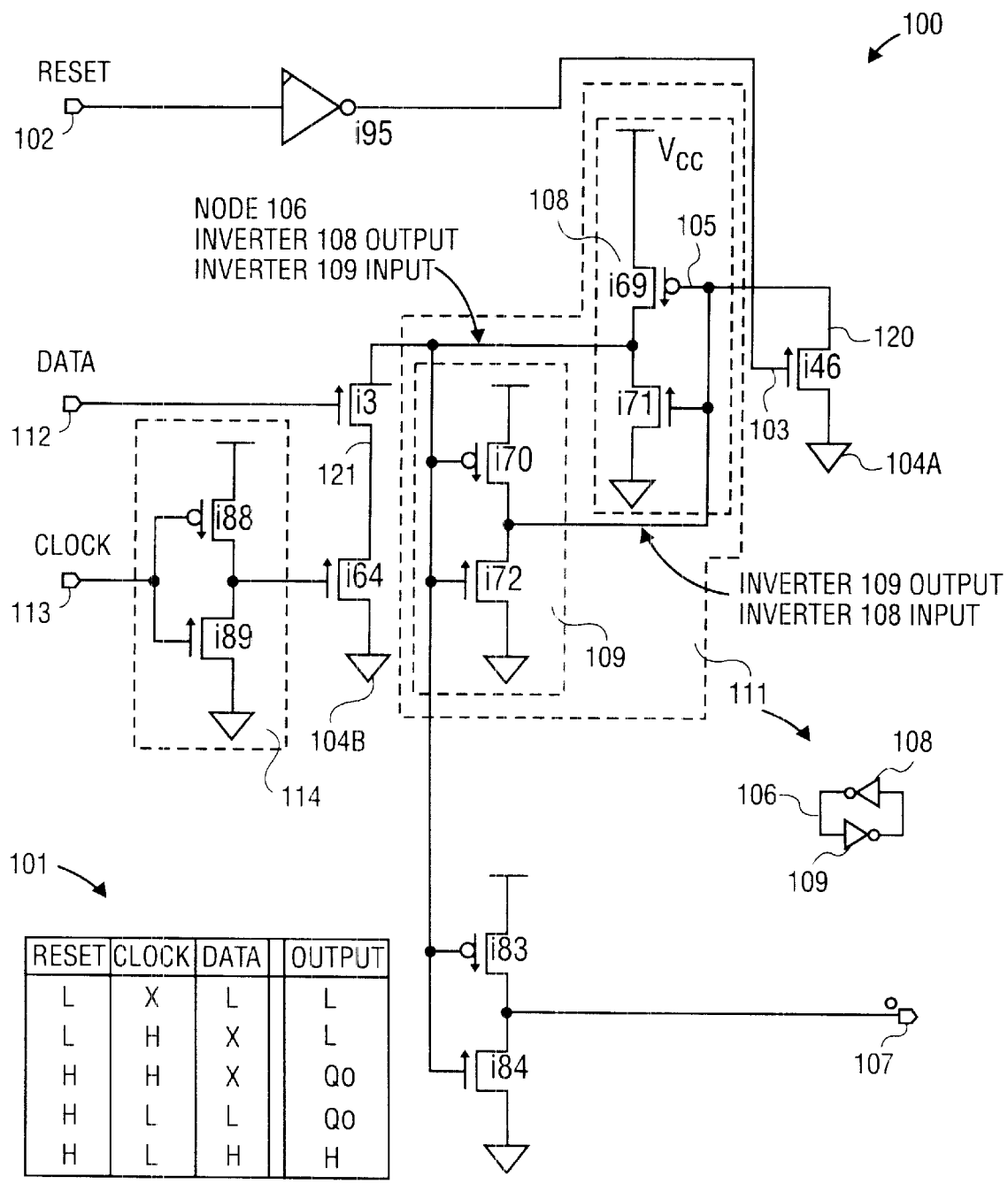
FIG. 1b is an embodiment of a latch circuit that may suffer a metastability.
Figure 2A:
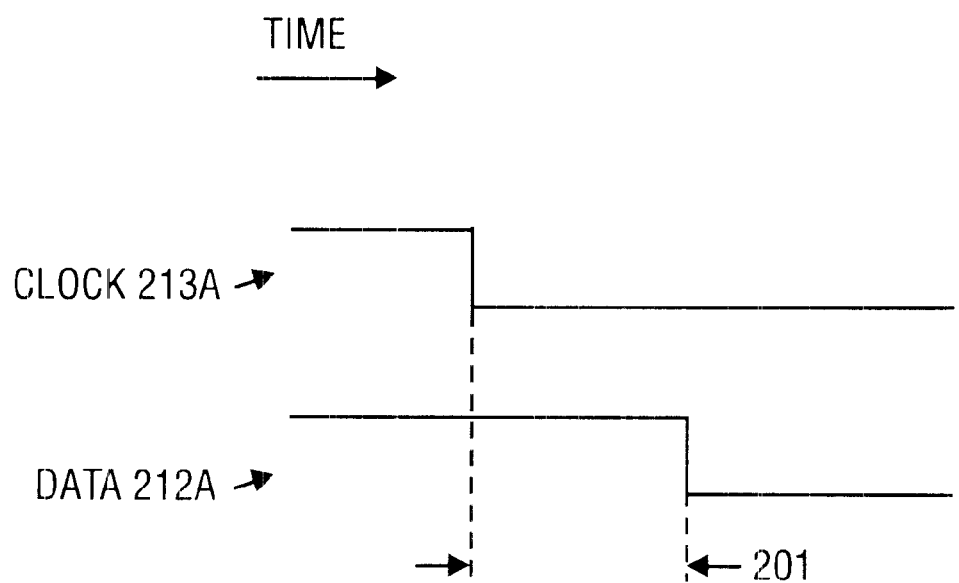
FIG. 2a is a timing condition for the latch circuit of FIG. 1b that does not cause a metastability.
Figure 2B:
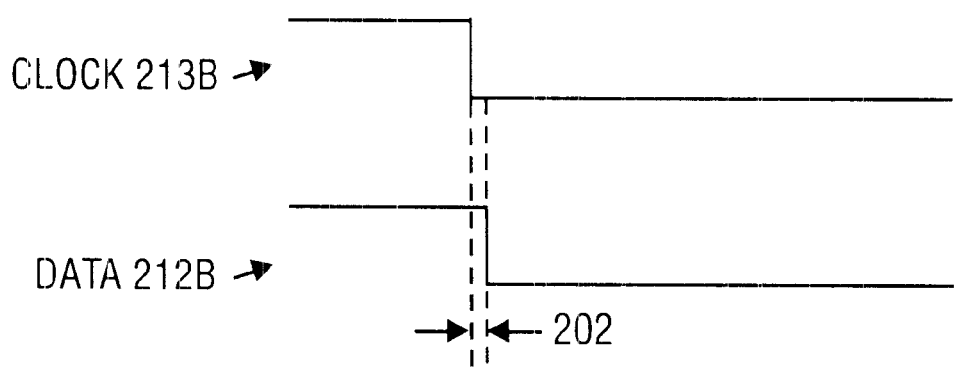
FIG. 2b is a timing condition for the latch circuit of FIG. 1b that does cause a metastability.

However, referring to FIG. 2B, if the DATA signal 212b falls in too short an amount of time 202 after the CLOCK signal 213b goes low, as shown in FIG. 2b, a metastability may occur. Another metastability condition (not shown in FIG. 2) may occur if the DATA signal transitions from low to high shortly before the CLOCK signal transitions from low to high. Referring back to FIG. 1b, in either of these cases, i3 is not on long enough to pull node 106 low. Generally, i3 is on for a brief time which drops node 106 somewhat, depending on how long the skew (i.e., the length of time 202) exists. If the length of time 202 is so short that i3 is on for such a brief time that node 106 hardly drops at all, the latch "misses" and does not flip.

If the length of time 202 is a little longer, node 106 drops enough to begin to affect the output of inverter circuit 109. That is, the inverter circuit 109 output begins to come up in voltage because the lowering of node 106 begins to turn on transistor i70. However, if i3 cuts off before node 106 drops far enough to fully turn on transistor i70 and fully turn off transistor i72 the inverter circuit 109 output voltage may end at a voltage that isn't capable of flipping inverter circuit 108. As a result, the latch core 111 sits in a metastable state where both node 106 and inverter circuit 109 output sit at a voltage level between the minimum logic high and the maximum logic low.

In most instances when a metastable state is entered, when i3 cuts off, there is a difference between the node 106 voltage level and the inverter circuit 109 output voltage level. For example, node 106 voltage may be higher than the inverter circuit 109 output voltage. In such a case, transistor i70 is not as active as transistor i72 and transistor i71 is not as active as transistor i69. As a result i69 is capable of driving more current into the capacitances associated with node 106 (e.g., device gate-to-source capacitance, interconnect capacitance, etc.) than transistor i71 is capable of pulling out of these same capacitances. Similarly, transistor i72 is capable of pulling more current out of associated capacitances than transistor i70 is capable of driving in.

As a result, node 106 is driven slightly higher and inverter circuit 109 output is driven slightly lower. This in turn makes transistors i69, i72 even more active and transistors i70, i71 even more cutoff. This results in node 106 being pulled even higher and inverter 109 output even lower. This runaway iterative process continues until transistors i69, i72 are fully on, transistors i70, i71 are completely cutoff, node 106 is at Vcc and inverter circuit output is at ground.

Another runaway iterative process results if node 106 is lower than inverter circuit 109 output when i3 finally cuts off. This process runs in the opposite direction such that ultimately transistors i69, i72 are completely off, transistors i70, i71 are fully on, node 106 is ground and inverter circuit 109 output is Vcc. The amount of time it takes for the runaway iterative process to complete itself adds to the propagation delay of the latch circuit 100.

Deep metastability, occurs when i3 cuts off at the exact moment node 106 and the inverter circuit 109 output are at the same voltage. In this instance, the two nodes simply "sit" unchanged until random thermal noise is able to trigger a runaway iterative process. Deep metastability further extends the propagation delay of latch circuit 100 as the circuit simply waits for a thermal noise trigger.

A way to statistically improve the propagation delay caused by metastability is to reduce the mean time consumed by the runaway iterative process. The mean time consumed by the runaway iterative process is inversely proportional to the gain of the transistors. That is, as transistor gain increases, the mean time consumed during the runaway iteration decreases. This follows from the aforementioned description of the runaway iterative process.

Specifically, as discussed, when i3 cuts off and node 106 voltage is higher than the inverter circuit 109 output voltage; transistor i70 is not as active as transistor i72 and transistor i71 is not as active as transistor i69. For the same voltage difference between node 106 and the inverter circuit 109 output discussed before, if the gains of the transistors are increased, transistor i69 is capable of driving even more current into the capacitances associated with node 106 and transistor i72 is capable of pulling even more current out of associated capacitances. Subsequently, node 106 is pulled up comparatively higher on the first iteration and inverter circuit 109 output is pulled down comparatively lower. This results in the final state (i.e., node 106 at Vcc and inverter circuit 109 output at ground) ultimately being realized in a comparatively shorter amount of time when transistor gain is increased.

One approach to increasing transistor gain is to make the transistors larger. That is, increase the gate width such that more carriers appear beneath the gate per unit of gate voltage applied. This may be suitable in some applications, however, demands on optimizing device real estate may limit the degree to which one may increase the transistor (or gate) width.

Another approach is to have unique doping concentrations for transistors requiring higher gain. For example, changing the n-well dopant concentration (as compared to the standard dopant concentration) in order to increase the gain of PFETs susceptible to metastability. However, this approach may complicate the manufacturing process by requiring an additional implant step.

Figure 3A:
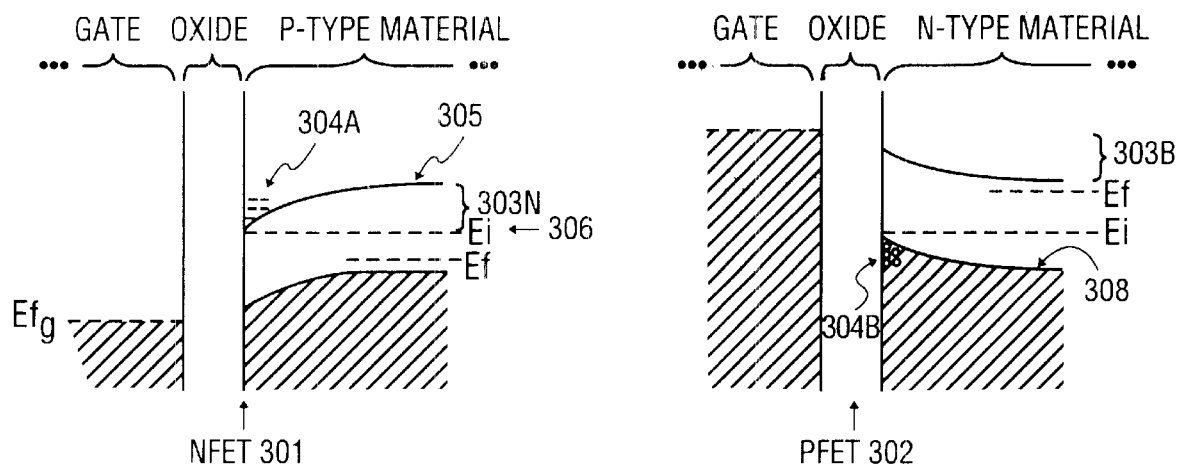
FIG. 3a is a depiction of active NFET and PFET devices.

A further approach is to backgate bias the transistors. Back gate biasing involves increasing the number of carriers within an inversion layer by applying a voltage bias to the channel material. FIG. 3a shows a Fermi energy diagram for an active NFET 301 and an active PFET 302. Both active devices 301, 302 have band bending 303a,b sufficient to cause an inversion layer 304a,b. An inversion layer 304a,b is an accumulation of carriers sufficient to form a conducting channel. For NFETs, (e.g., NFET 301) when the forward bias voltage is applied at the gate, the conduction band 305 approaches or crosses the bulk intrinsic energy level 306 near the oxide interface creating an energy potential well that naturally accumulates electrons. These electrons create the conducting channel (also referred to simply as a channel) associated with an on device. For PFETs (e.g., PFET 302), application of the forward bias voltage to the gate causes the valence band 308 to bend upward creating an energy potential well near the oxide interface that accumulates current transport entities typically referred to as holes. Thus, FIG. 3a shows the device physics concerning the manner in which MOSFETs turn "on".

Figure 3B:
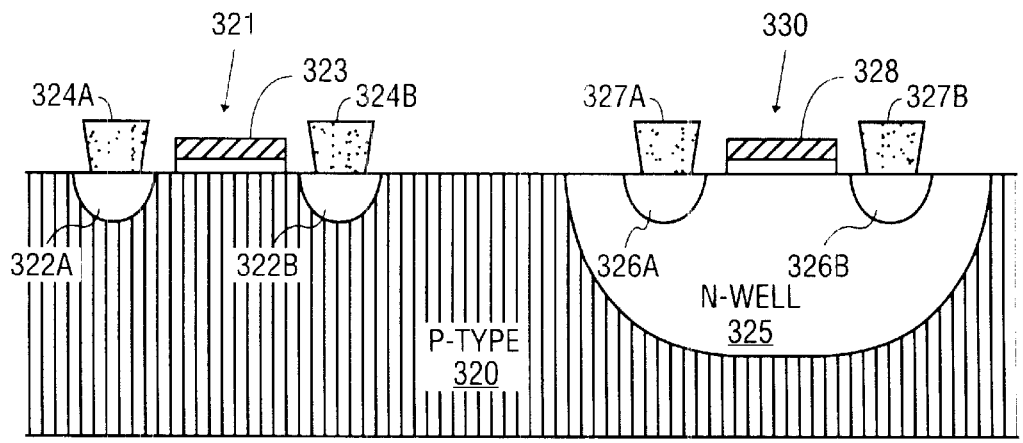
FIG. 3b is a depiction of an n-well MOSFET technology.

FIG. 3b shows a typical CMOS technology. Specifically, the technology is comprised of a wafer of silicon that is doped p-type 320. NFET transistors 321 are formed by doping drain and source regions with n-type material 322a,b and forming gate structure 323 and source/drain contacts 324a,b over n-type material 322a,b. PFET devices 330 are formed by doping an n-well region 325 in the p-type wafer 320 and subsequently doping the n-well region 325 with p-type material 326a,b. Similarly, gate structure 328 and source/drain contacts 327a,b are formed over the n-well region 325 and p-type material 326a,b respectively. The particular type of CMOS technology shown in FIG. 3B may be referred to as "n-well" technology.

Backgate biasing involves applying a voltage to the material that supports an inversion layer. For the n-well technology of FIG. 3b, this corresponds to the p-type wafer material 320 for the NFET device 321 and the n-well region 325 for the PFET device 330. By biasing the material comprising the conducting channel the number of carriers in the conducting channel per applied gate voltage may be made to increase. For example, refer to FIG. 3c, where a depiction is shown of the junction between the n-well 325 and the p-type material 326b at the PFET 330 source. For simplicity, region 326b may also be referred to as the PFET source.

Figure 3C:
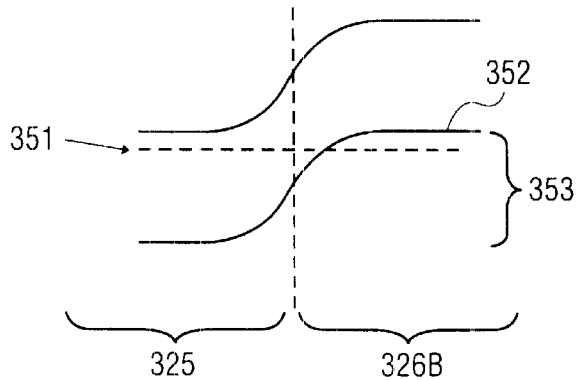
FIG. 3c is an n-well/source junction formed by the n-well MOSET technology of FIG. 3b.

In FIG. 3c there is no back gate biasing or applied gate voltage. Typically, the p-type material 326b is degenerately doped thus the fermi level 351 resides beneath the valence band 352 within that material. Note that a potential barrier 353 exists between the n-well 325 and the p-type material 326b. This potential barrier 353 prevents the entry of hole carriers from the source 326b into the conducting channel (when an inversion layer is formed) which ultimately limits the gain of the device.

By biasing the n-well 325, at a potential less than the source 326b the potential barrier 353 is reduced. That is, if such a potential is applied to the n-well 325, the fermi levels of the two materials 325, 326b separate in a direction that reduces the potential barrier 353. Ultimately this allows for more hole type carriers to enter the conducting channel/inversion layer 304b when a proper gate bias is applied which effectively is an increase in device gain as well as a reduction in threshold voltage. Thus backgate biasing for PFET devices involves lowering the n-well 325 potential beneath the source 326b potential.

A similar approach may be employed for NFET devices. Specifically, for technologies that permit back gate biasing for NFET devices (e.g., dual well technologies), the p-well material 320 may be biased above the (typically) degenerately doped n-type material 322a at the source resulting in potential barrier reduction and enhanced electron carrier concentrations in the conducting channel.

Typically, the wafer (i.e., p-type material 320) is grounded 328, thus backgate biasing is not possible for NFET devices in the n-well technology of FIG. 3b. However, the n-well region 325 may receive an applied voltage. As such, PFET transistors may be backgate biased (by putting the n-well 325 potential beneath) in the technology of FIG. 3b.

An additional note needs mention. Specifically, n-well region 325 and source 326b form a p-n junction which, if forward biased, results in an "on" parasitic diode. In order to prevent the parasitic diode from turning "on", the n-well 325 is usually biased at $V_{cc}$. Since backgate biasing involves placing the n-well 325 potential beneath the source 326b potential, backgate biasing is typically implemented by placing the n-well 325 at a voltage modestly below $V_{cc}$ where the source 326b is tied to $V_{cc}$.

Backgate biasing is possible in other technologies as well. That is, other technologies may choose to employ a dual well structure. For example, some technologies may form a doped n-well region for PFETs and a doped p-well region for NFETs where the wafer material is intrinsic (i.e., undoped). Other technologies may employ n-type wafer material having only p-wells. That is, the wafer material is n-type making PFETs incapable of back biasing (since the wafer is typically grounded). Regardless, if the material comprising the inversion layer can have a bias applied to it, the gain of its transistors may be increased via a backgate bias to reduce the mean propagation delay of the metastability situation.

Figure 4:
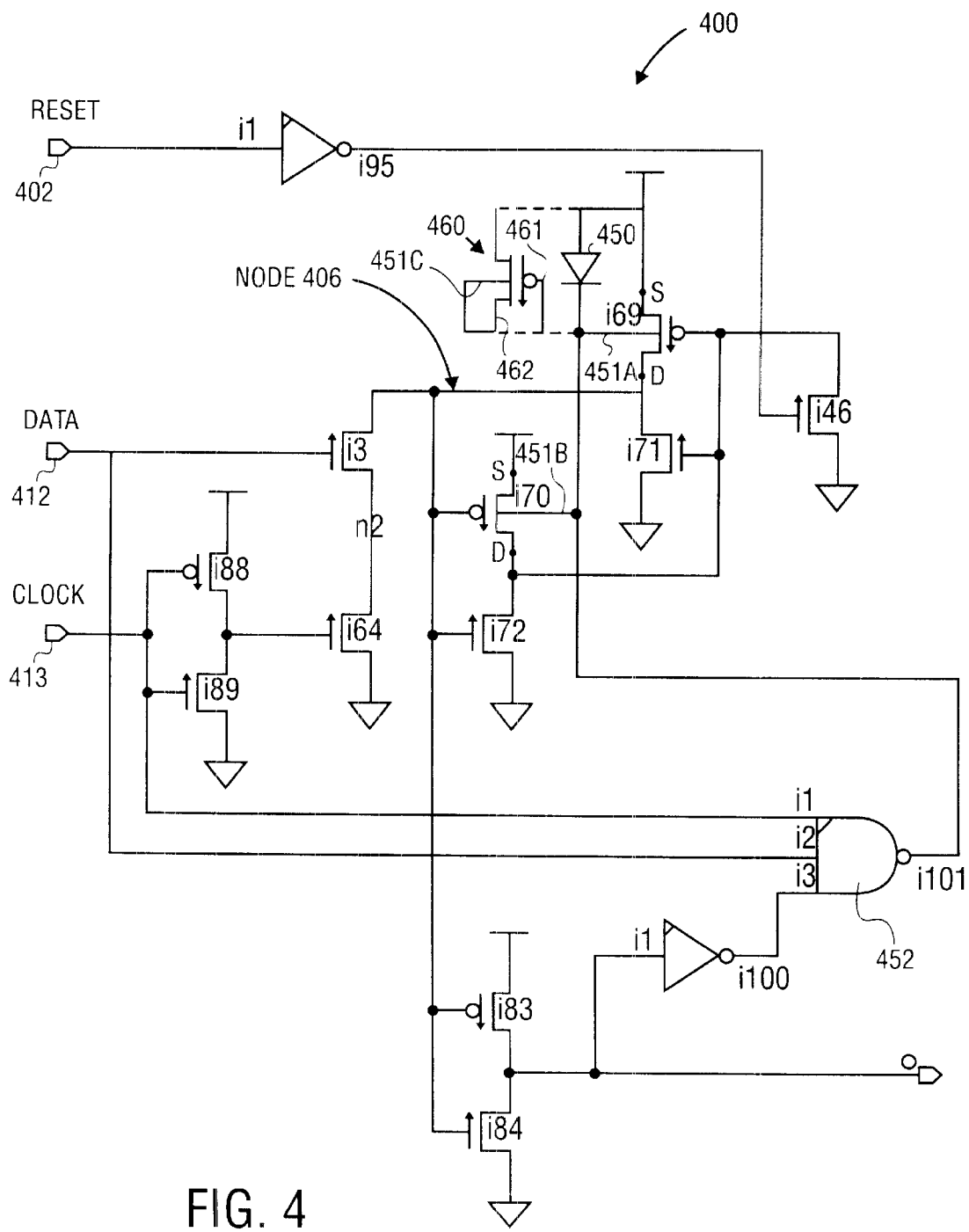
FIG. 4 is an improved latch circuit.

FIG. 4, shows the circuit 400 of FIG. 1b modified to provide for backgate biasing. The embodiment shown in FIG. 4 employs only n-wells, thus only PFET devices are backgate biased. Furthermore, as discussed the n-well potential is typically $V_{cc}$ and the wafer is grounded. Back gate bias nets 451a,b are applied to each of the PFET transistors i69, i70 in order to apply the back gate bias voltage. Diode 450 corresponds to a parasitic device that the modified circuit 400 must account for.

Specifically, referring briefly back to FIG. 3c, parasitic diode 450 corresponds to the p-n junction formed between the source 326b and the n-well region 325. As the PFET device is back gate biased by dropping the n-well 325 voltage below Vcc, diode 450 will turn on since the source 326b is tied to Vcc (referring back to transistors i69, i70 of FIG. 4). Note that the parasitic diode 450 tends to clamp the backgate bias voltage to Vcc −0.7 volts.

In the embodiment of FIG. 4, the improved circuit 400 is configured to apply the backgate bias voltage when a metastability may occur. Referring back to the discussion concerning FIG. 2, remember that one of the described conditions of metastability was if the DATA signal transitioned from low to high shortly before the CLOCK signal transitioned from low to high. If such a case occurs, both DATA 412 and CLOCK 413 will be high (both having just transitioned there) during the metastability condition. NAND gate 452 is used to apply the backgate voltage only when DATA 412 and CLOCK 413 as well as node 406 are high. Thus, NAND gate 452 is designed to apply the backgate bias when there is a possibility of metastability based on logic high values of DATA 412 and CLOCK 413. Additional logic gates could be employed for other metastability conditions as well (i.e., the metastability condition caused by the logic inputs of FIG. 2b). Furthermore, gate i100 could be removed for spatial considerations, although it will result in backgate bias voltage applied from NAND gate 452 when metastability conditions are non-existent. This may increase power consumption via parasitic diode 450 described next.

FIG. 4 also shows a further improved circuit comprising a clamping device 460 shunted across the parasitic diode 450. Dashed lines are shown connecting clamping devices 460 to the circuit in order to convey that device 460 is optional. Different device dimensions and geometries will introduce different V-I characteristics for parasitic diode 450. Thus the addition of clamping device 460 may or may not be optimal. In this embodiment, the clamping device 460 is a backgated PFET transistor having the back gate bias net 451c, gate 461 and drain 462 all tied together. That is, a backgated PFET 460 is configured as a standard clamp. Clamps constructed out of FETs have an approximate relationship that describes their voltage drop as a function of $I_{DS}$ current, provided in Equation 1:

$$V_{GS} \approx V_T + \sqrt{\frac{I_{DS}}{\beta}} \quad \text{Equation 1}$$

where β is the device gain, Vt is the device threshold voltage and $I_{DS}$ is the drain/source current. For small $I_{DS}$ and large β, the voltage drop across the clamping device is approximately equal to the threshold voltage. In many semiconductor processes, back gated PFETs have a smaller Vt than the turn on voltage of the parasitic diode 450. Thus this particular embodiment (which employs device 460) has such a process related dependency. Since the backgated PFET 460 Vt is less than the parasitic diode 450 turn on voltage, the backgated PFET 460 will clamp the parasitic diode voltage such that the parasitic current through it is minimized.

Also, note that there is only one clamping device 460 employed for two back gated PFETs i69, i70. Given that there is one parasitic diode per back gated device it may seem logical to require one clamp per device. However, the function of the clamp actually controls the voltage difference between Vcc and the n-well the back gated devices are located within. Thus, in the embodiment of FIG. 4, the backgated devices i69, i70 are located within the same n-well. As such, only one clamp device is needed for both devices i69, i70. If the devices i69, i70 were located in different n-wells two clamping devices would be necessary.

It is important to note that the employment of backgated devices is useful in embodiments other than the specific latch circuit of FIG. 4. That is, any latch design is capable of entering a metastability and as such, its runaway iteration process mean time may be reduced by increasing the gain of its transistors. Thus the idea of increasing transistor gain through back gate biasing may be applied to any circuit having a latch core such as latch core 111 of FIG. 1b. Other gain increasing techniques applicable to other technologies such as bipolar, MESFET or HBT may also be used for latch cores implemented in such technologies.

Furthermore, as discussed, any increase in device gain will reduce the mean runaway iterative process time. As such, not only PFETs but also NFETs may employ back gate biasing techniques to increase gain. These techniques are possible if the specific technology allows for back gate biasing which may depend on the well technology employed.

Note that the approach described above causes a gain imbalance in transistors in order to quicken the time for the latch to flip. In other embodiments, a gain imbalance may be created by lowering the gain of certain transistors. For example, backgate bias nets may be used to supply a voltage that removes carriers in NFETs associated with a p-well technology.

Thus a latch circuit that improves the mean delay caused by metastability has been described.

What is claimed is:

1. An apparatus, comprising:

a latch circuit having an input of a first inverter coupled to an output of a second inverter at a first node, and, an input of said second inverter coupled to an output of said first inverter at a second node, said latch circuit at a first stable state when said first node is at a first voltage and said second node is at second voltage, said latch circuit at a second stable state when said first node is at said second voltage and said second node is at said first voltage, said latch circuit having a metastable state that is approached as said first and said second nodes approach a third voltage between said first and second voltages, said first and second inverters each having a transistor with a back gate bias node that receives a back gate bias voltage, said back gate bias voltage provided by a logic circuit in response to an input applied to said latch circuit, wherein said back gate bias voltage increases the gain of said transistors so as to avoid said metastable state as a result of said input being applied to said latch circuit, said input being a data signal value and a clock signal value that could have been transitioned to such that the transition to said data signal value was sufficiently proximate to the transition to said clock signal value so as to cause said metastable state, said latch circuit designed to latch a value of said data signal on a said clock signal transition.

2. The apparatus of claim 1 wherein said transistors are PFET transistors.

3. The apparatus of claim 2 wherein said PFET transistors are implemented within a n-well.

4. The apparatus of claim 2 further comprising a clamp across one of said PFET transistors.

5. The apparatus of claim 1 wherein said logic gate is a NAND gate.

6. The apparatus of claim 1 wherein said back gate bias voltage is further provided by said logic gate in response to said input and a voltage on one of said nodes.

7. The apparatus of claim 1 wherein another data signal value can be latched on a rising said clock signal transition.

8. The apparatus of claim 1 further comprising a reset signal that resets said latch circuit to one of said stable states.

9. A method, comprising:

a) offering an input to a latch circuit, said latch circuit having an input of a first inverter coupled to an output of a second inverter at a first node, and, an input of said second inverter coupled to an output of said first inverter at a second node, said latch circuit at a first stable state when said first node is at a first voltage and said second node is at second voltage, said latch circuit at a second stable state when said first node is at said second voltage and said second node is at said first voltage, said latch circuit having a metastable state that is approached as said first and said second nodes approach a third voltage between said first and second voltages, a first transistor within said first inverter and a second transistor within said second inverter; and b) increasing the gain of said transistors, when said input corresponds to a cause of said metastable state, by providing a back gate bias to said transistors with a logic circuit that recognizes the presence of said input, said input being a data signal value and a clock signal value that could have been transitioned to such that the transition to said data signal value was sufficiently proximate to the transition to said clock signal value so as to cause said metastable state, said latch circuit designed to latch a value of said data signal on a said clock signal transition.

10. The method of claim 9 wherein said transistors are PFET transistors.

11. The method of claim 10 wherein said PFET transistors are implemented within a n-well.

12. The method of claim 9 wherein said back gate bias voltage is further provided by said logic gate in response to said input and a voltage on one of said nodes.

13. The method of claim 9 further comprising latching another data signal value on a rising said clock signal transition.

14. The method of claim 9 further comprising resetting said latch circuit to one of said stable states.

* * * * *